(12) United States Patent
Ershov

(10) Patent No.: US 9,280,053 B2
(45) Date of Patent: Mar. 8, 2016

(54) APPARATUS FOR AND METHOD OF TEMPERATURE COMPENSATION IN HIGH POWER FOCUSING SYSTEM FOR EUV LPP SOURCE

(71) Applicant: Cymer LLC, San Diego, CA (US)

(72) Inventor: Alexander I. Ershov, Escondido, CA (US)

(73) Assignee: CYMER, LLC, Veldhoven (NL)

( * ) Notice: Subject to any disclaimer, the term of this patent is extended or adjusted under 35 U.S.C. 154(b) by 217 days.

(21) Appl. No.: 14/017,882

(22) Filed: Sep. 4, 2013

(65) Prior Publication Data

US 2015/0062544 A1    Mar. 5, 2015

(51) Int. Cl.
G03B 27/54    (2006.01)
G03B 27/52    (2006.01)
G03F 7/20     (2006.01)

(52) U.S. Cl.
CPC ........ *G03F 7/70033* (2013.01); *G03F 7/70041* (2013.01)

(58) Field of Classification Search
CPC ................. G03F 7/700033; G03F 7/70041
USPC ................. 355/30, 53, 67; 359/641, 285
See application file for complete search history.

(56) References Cited

U.S. PATENT DOCUMENTS

| | | | |
|---|---|---|---|
| 5,386,427 A * | 1/1995 | Zayhowski | G02B 7/028 372/101 |
| 6,498,685 B1 | 12/2002 | Johnson | |
| 2005/0271109 A1 | 12/2005 | Knowles et al. | |
| 2007/0133103 A1 | 6/2007 | Stempel et al. | |
| 2011/0249342 A1 | 10/2011 | Scaggs | |
| 2012/0092746 A1 | 4/2012 | Hou et al. | |

OTHER PUBLICATIONS

International Search Report and Written Opinion, dated Dec. 17, 2014, issued in corresponding International Application No. PCT/US2014/052173.

* cited by examiner

*Primary Examiner* — Hung Henry Nguyen
(74) *Attorney, Agent, or Firm* — Arent Fox LLP

(57) ABSTRACT

Apparatus for and method of temperature compensating a focusing system in having at least one transmissive optical element with a thermal lens. A reflective optical element is introduced having a thermal lens complementary to the thermal lens of the transmissive optical element so that the combined optical characteristics of the two optical elements are substantially temperature independent. Provision can also be made for a change in the absorption of the transmissive optical element over time. The focusing system is especially applicable to systems for generating EUV light for use in semiconductor photolithography.

49 Claims, 4 Drawing Sheets

APPARATUS FOR AND METHOD OF TEMPERATURE COMPENSATION IN HIGH POWER FOCUSING SYSTEM FOR EUV LPP SOURCE

FIELD

The present disclosure relates to temperature compensated focusing of laser radiation from a laser source in a system for producing extreme ultraviolet radiation using a laser produced plasma.

BACKGROUND

Extreme ultraviolet ("EUV") light, e.g., electromagnetic radiation having wavelengths of around 50 nm or less (also sometimes referred to as soft x-rays), and including light at a wavelength of about 13.5 nm, can be used in photolithography processes to produce extremely small features in substrates such as silicon wafers. Here and elsewhere, it will be understood that the term "light" is used to encompass electromagnetic radiation regardless of whether it is within the visible part of the spectrum.

Methods for generating EUV light include converting a source material from a liquid state into a plasma state. The source material preferably includes at least one element, e.g., xenon, lithium or tin, with one or more emission lines in the EUV part of the spectrum. In one such method, often termed laser produced plasma ("LPP"), the required plasma can be produced by using a laser beam to irradiate a source material having the required line-emitting element.

One LPP technique involves generating a stream of source material droplets and irradiating at least some of the droplets with laser light. In more theoretical terms, LPP light sources generate EUV radiation by depositing laser energy into a source material having at least one EUV emitting element, such as xenon (Xe), tin (Sn), or lithium (Li), creating a highly ionized plasma with electron temperatures of several 10's of eV.

The energetic radiation generated during de-excitation and recombination of these ions is emitted from the plasma in all directions. In one common arrangement, a near-normal-incidence mirror (often termed a "collector mirror" or simply a "collector") is positioned to collect, direct (and in some arrangements, focus) the light to an intermediate location. The collected light may then be relayed from the intermediate location to a set of scanner optics and ultimately to a wafer.

In some LPP systems each droplet is sequentially illuminated by multiple light pulses. In some cases, each droplet may be exposed to a so-called "pre-pulse" and then to a so-called "main pulse." It is to be appreciated, however, that the use of a pre-pulse is optional, that more than one pre-pulse may be used, that more than one main pulse may be used, and that the functions of the pre-pulse and main pulse may overlap to some extent.

Typically, a pre-pulse may cause some or all of the source material to heat, expand, gasify, vaporize, ionize, generate a weak plasma, or generate a strong plasma, or some combination of these, and a main pulse may convert most or all of the material affected by the pre-pulse into plasma and thereby produce an EUV light emission. Pre-pulsing may increase the efficiency of the source material/pulse interaction due to a larger cross-section of material that is exposed to the main pulse, a greater penetration of the main pulse into the material due to the material's decreased density, or both. Another potential benefit of pre-pulsing is that it may expand the target to the size of the focused main pulse, allowing all of the main pulse to participate in conversion of the source material into a plasma. This may be especially beneficial if relatively small droplets are used as targets and the irradiating light cannot be focused to the size of the small droplet. Thus, in some applications, it may be desirable to use pre-pulsing to increase conversion efficiency and/or allow use of relatively small, e.g., so-called, mass limited targets. The use of relatively small targets, in turn, may be used to lower debris generation and/or reduce source material consumption.

The main pulse and the pre-pulse, if it is used, must generally be directed and focused onto the droplets of source material by using a focusing system. Generally in a high power focusing system for an EUV LPP source the optical elements in the beam path absorb some of the energy from the main pulse and the pre-pulse causing heating in those optical elements. This heating creates a thermally-induced optical distortion (also known as a "thermal lens") by virtue of the temperature dependence of the refractive index and the coefficient of thermal expansion of the material making up the optical element. The thermal lens alters the optical power of the optical elements causing deviations from optimal values.

It would thus be advantageous to be able to negate the effects of thermal lensing and so to avoid the performance limitations it imposes.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

In one aspect, there is provided an apparatus for and method of temperature compensating a focusing system in which the focusing system has at least one transmissive optical element having a thermal lens. A reflective optical element is added to the system that has a thermal lens that is complementary to the thermal lens of the transmissive optical element so that the optical characteristics of the two optical elements combined are substantially temperature independent. The respective thermal lenses of the two optical elements are balanced by selecting materials for the reflective optical element that have the correct optical absorption based on the absorption of the transmissive optical element and the relative strengths of the thermal lenses. Provision can also be made for a change in the absorption of the transmissive optical element over time by selecting a value for the absorption of the reflective optical element that exceeds a contemporaneous value for the absorption of the transmissive optical element and then cooling the reflective optical element to reduce the strength of its thermal lens, with provision for increasing the temperature of the reflective optical component over time. The focusing system may also include a pulse combiner for combining pulses from multiple sources. The focusing system is especially applicable to systems for generating EUV light for use in semiconductor photolithography.

In another aspect, a focusing system includes a transmissive optical element arranged to receive and focus a light beam, the transmissive optical element having a first thermal lens power having a first value and a first absorption, and a reflective thermal lens compensating plate arranged to receive the light beam at least indirectly from a light beam source and reflect the light beam before the light beam reaches the transmissive optical element, the reflective thermal lens compensating plate having a second thermal lens power having a second value and a second absorption, wherein the sign of the first value and the second value are opposite to one another and wherein a material for the reflective thermal lens compensating plate is chosen so that the second absorption relates to the first absorption and a relative absolute magnitude of the first value and the second value such that a thermal lens of the thermal lens compensating plate substantially completely compensates for a thermal lens of the transmissive optical element. The transmissive optical element and the reflective thermal lens compensating plate preferably both include the same material, which may be zinc selenide. Other materials, for example, potassium chloride, sodium chloride, potassium bromide, diamond, etc. can also be used. The reflective thermal lens compensating plate may have a reflective coating, in which case the second absorption is selected by selecting the absorption of the coating. The reflective coating may be on a front surface or a back surface of the reflective thermal lens compensating plate. The reflective coating may include gold, copper, or molybdenum.

The focusing system may further include a pulse combiner in arrangements using a main pulse and a pre-pulse. In systems where the pre-pulse and the main pulse propagate along a common beam path before impinging on the pulse combiner and the pulse combiner may comprise an optical wedge. In such systems in which the pre-pulse is generated by a $CO_2$ laser and the optical wedge may comprise ZnSe with a dichroic coating, with a front surface that is highly reflective to the main pulse and a back surface that is highly reflective to the pre-pulse. In such systems in which the pre-pulse is generated by a YAG laser, the optical wedge may comprise fused silica or ZnSe. The back surface of the optical wedge may be curved to compensate for chromatic aberrations in the final focus lens.

In systems in which the pre-pulse and the main pulse propagate along separate beam paths before impinging on the pulse combiner and the pre-pulse is generated by a $CO_2$ laser, the pulse combiner may comprise ZnSe with a maximum metal reflector coating. In systems in which the pre-pulse and the main pulse propagate along separate beam paths before impinging on the pulse combiner and the pre-pulse is generated by a YAG laser the pulse combiner may comprise a material having a very low coefficient of thermal expansion such as fused silica or a titania-silicate glass or a lithium aluminosilicate glass-ceramic. Also in such systems the pulse combiner may comprise a coating having high reflectivity at about 10.6 µm and high transmissivity at about 1.064 µm.

In another aspect, the focusing system includes a transmissive optical element arranged to receive and focus a light beam, the first transmissive optical element having a first thermal lens power having a first value and a first absorption, the first absorption increasing from a first absorption value to a second absorption value as a cumulative amount of time the first transmissive element is used to focus the light beam increases, and a reflective thermal lens compensating plate arranged to receive the light beam at least indirectly from a light beam source and reflect the light beam towards the transmissive optical element; the first transmissive element having a second thermal lens power having a second value and a second absorption, in which the sign of the first value and the second value are opposite to one another and in which the second absorption is selected based on the second absorption value and a relative absolute magnitude of the first value and the second value. The system further includes a cooling element in thermal communication with the thermal lens compensating plate, the cooling element controlling the temperature of the thermal lens compensating plate such that a thermal lens of the thermal lens compensating plate substantially completely compensates for a thermal lens of the transmissive optical element so that the optical characteristics of the focusing system are substantially independent of temperature within the operating temperatures of the system.

The second absorption value may be an expected end-of life value for the transmissive optical element. The cooling element may be configured as a cooling plate in thermal communication with the thermal lens compensating plate. The cooling element may include a control system for controlling a temperature of the thermal lens compensating plate by controlling a temperature of the cooling plate. The control system may control the temperature of the cooling plate based on an amount of time. The cooling plate may be separated from the thermal lens compensating plate by a gap. The control system may control the temperature of the thermal lens compensating plate by controlling a thickness of the gap.

In another aspect, a method of temperature compensating a focusing system is provided, the method including the steps of regulating a temperature of a thermal lens compensation plate to a first temperature, the first temperature being based on an optical absorption of the thermal lens compensation plate, the optical absorption having been determined based at least in part on an expected end-of-lifetime value for focus lens optical absorption for a final focus lens includes part of the focusing system, determining a value representative of cumulative time in use of the focusing system, and adjusting the temperature of the thermal lens compensation plate to a second temperature higher than the first temperature, the second temperature having a value based at least in part on the cumulative time in use. The adjusting step may be carried out periodically or continuously.

DETAILED DESCRIPTION

Figure 1:
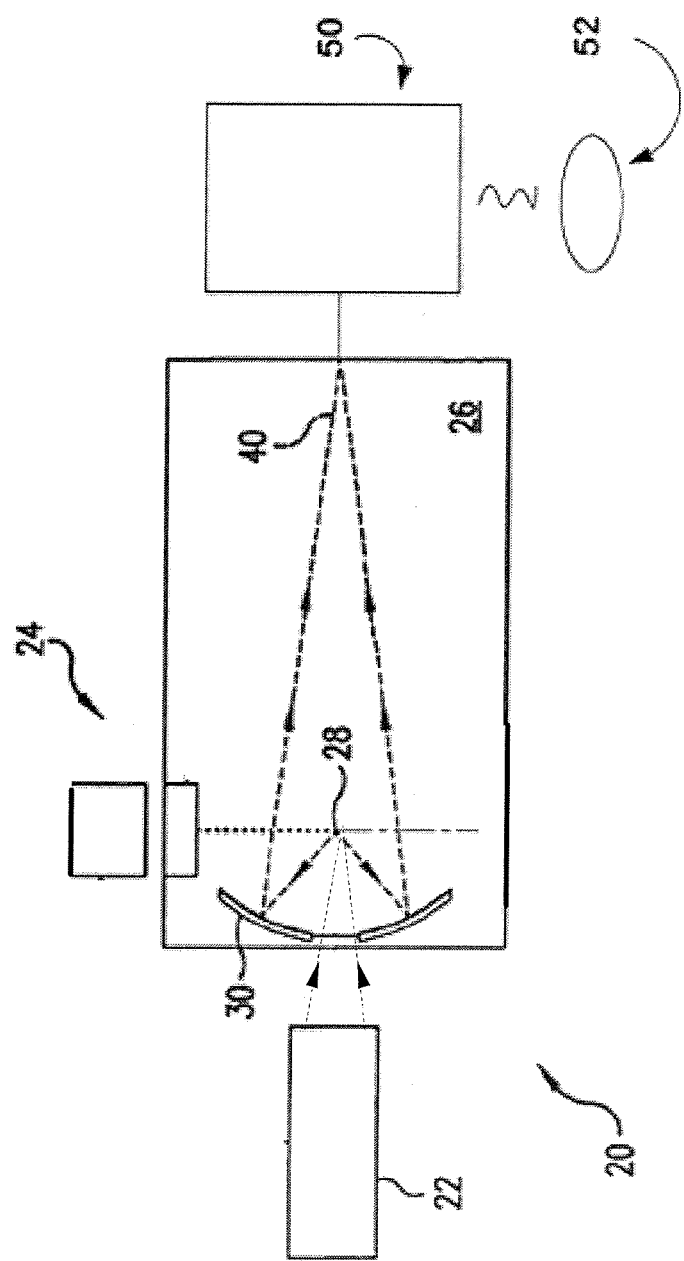
FIG. 1 is a diagrammatic not-to-scale view of an overall broad conception for a laser-produced plasma EUV light source system according to an aspect of the present invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

With initial reference to FIG. 1 there is shown a schematic view of an exemplary EUV light source, e.g., an LPP EUV light source 20 according to one aspect of an embodiment of the present invention. As shown, the EUV light source 20 may include a pulsed or continuous laser source 22, which may for example be a pulsed gas discharge $CO_2$ laser source producing radiation at 10.6 μm. The pulsed gas discharge $CO_2$ laser source may have DC or RF excitation operating at high power and high pulse repetition rate. As noted, the laser source 22 may also include the capability of delivering multiple pulses to a given volume of source material, including one or more pre-pulses.

The EUV light source 20 also includes a source delivery system 24 for delivering source material in the form of liquid droplets or a continuous liquid stream. The source material may be made up of tin or a tin compound, although other materials could be used. The source delivery system 24 introduces the source material into the interior of a vessel or chamber 26 to an irradiation region 28 where the source material may be irradiated to produce plasma. In some cases, an electrical charge is placed on the source material to permit the source material to be steered toward or away from the irradiation region 28. It should be noted that as used herein an irradiation region is a region where source material irradiation may occur, and is an irradiation region even at times when no irradiation is actually occurring.

Continuing with FIG. 1, the light source 20 may also include one or more optical elements such as a collector 30. The collector 30 may be a normal incidence reflector, for example, implemented as a multilayer mirror (MLM), that is, a SiC substrate coated with a Mo/Si multilayer with additional thin barrier layers deposited at each interface to effectively block thermally-induced interlayer diffusion. Other substrate materials, such as Al or Si, can also be used. The collector 30 may be in the form of a prolate ellipsoid, with an aperture to allow the laser light to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV light may be output from the EUV light source 20 and input to, e.g., an integrated circuit lithography tool 50 which uses the light, for example, to process a silicon wafer workpiece 52 in a known manner. The silicon wafer workpiece 52 is then additionally processed in a known manner to obtain an integrated circuit device.

Figure 2:
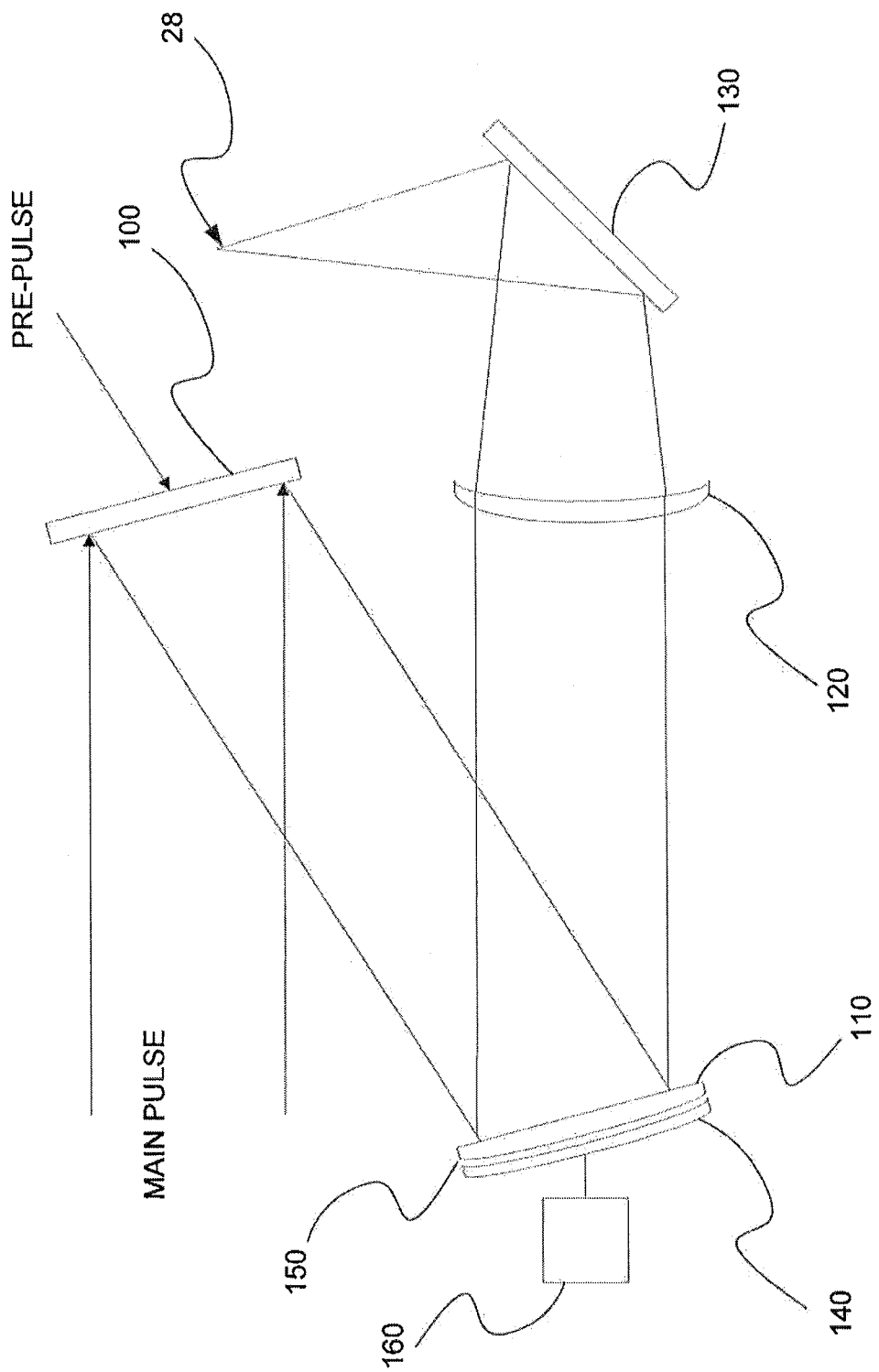
FIG. 2 is a diagrammatic not-to-scale view of a first embodiment of a laser source according to one aspect of the present invention.

An arrangement for the laser source 22 is shown in FIG. 2. As shown in FIG. 2, a main pulse from a laser (not shown) is caused to impinge on a pulse combiner 100. The main pulse can come from any suitable laser such as a $CO_2$ laser. Also in the arrangement of FIG. 2 a pre-pulse is applied as described above. The source of the pre-pulse may be any suitable laser such as a $CO_2$ or YAG laser (not shown). It will be readily appreciated by one having ordinary skill in the art, however, that the teachings of this disclosure can be applied to systems in which no pre-pulse is used or is not always used.

The pulse combiner 100 is preferably made of zinc selenide (ZnSe) with a maximum metal reflector (MMR) coating if a pre-pulse from a $CO_2$ laser is used. If a pre-pulse from a YAG laser is used, then the pulse combiner 100 is preferably made of a material having a very low coefficient of thermal expansion such as fused silica or a titania-silicate glass such as that sold under the trademark ULE® by Corning Glass Works, or a lithium aluminosilicate glass-ceramic such as that sold under the trademark ZERODUR® by Schott AG. Also if a pre-pulse from a YAG laser is used it is preferable to provide the pulse combiner 100 with a coating having high reflectivity at 10.6 μm and high transmissivity at 1.064 μm.

The embodiment of FIG. 2 also includes a thermal lens compensating plate 110. The thermal lens compensating plate 110 is preferably made of ZnSe and is preferably provided with a highly reflective coating. In this context, highly reflective refers to a coating having less than about 2% absorption. One of ordinary skill in the art will appreciate that many materials can be used for the coating, such a copper, gold, or molybdenum. The thermal lens compensating plate 110 may have a coating on either its front or rear surface.

As described more fully below, the absorption of the thermal lens compensating plate 110 is chosen to compensate for thermal lensing in a downstream lens 120 which may be a final focus lens for the system. The lens 120 is preferably made of the same material as the thermal lens compensating plate 110, e.g., preferably ZnSe. Also, cooling conditions at the lens 120 and at the edge of the thermal lens compensating plate 110 are preferably made substantially the same. As used herein, "temperature compensation" refers to establishing complementary properties so that the optical properties of the combined system of the thermal lens compensating plate 110 and the lens 120 are substantially independent of temperature.

FIG. 2 shows an arrangement in which there are no intervening optical elements between the thermal lens compensating plate and the lens 120. It will be readily appreciated by one having ordinary skill in the art, however that there could be intervening optical elements between the thermal lens compensating plate and the lens 120, for example, for packaging or for geometrical layout purposes.

In the case of a pre-pulse from a $CO_2$ laser, most of the thermal lens will occur in the lens 120 and the thermal lens compensating plate 110 can provide compensation for both the lens 120 and the pre-pulse combiner 100. In case of a pre-pulse from a YAG laser, the material choice for the pre-pulse combiner 100 should eliminate the thermal lens in the pre-pulse combiner 100 for the main pulse. The thermal lens in the pre-pulse combiner 100 for the pre-pulse is less critical but can be compensated as well if design requirements compel such compensation.

As noted, the system made up of thermal lens compensating plate 110 and lens 120 preferably uses two optical elements made of the same material. One optical element, the lens 120, is used to focus the light onto the irradiation region 28 after it is steered by a steering mirror 130, preferably made of copper. The thermal lens created in this optical element is compensated by the thermal lens compensation plate 110. As noted, both of these optical elements may preferably be made from ZnSe, but other materials can be used, for example, ZnS, Ge, Other materials, for example, potassium chloride, sodium chloride, potassium bromide and so on.

The thermal lens compensation plate 110 acts as a mirror for the light emitted by the $CO_2$ laser. The thermal lens of a lens such as the lens 120 and the thermal lens of a mirror such as a thermal lens compensation plate 110 can be described mathematically. For the lens the relationship is:

$$\Delta(nl)_{lens} = \left(\frac{dn}{dt}\right) \times L \times \Delta t + CTE \times n \times L \times \Delta t$$

where (dn/dt) is the change in refractive index with temperature for a given lens material, L is the focal length of the lens, Δt is the change in temperature, CTE is the coefficient of thermal expansion for a given lens material, and n is the refractive index for a given lens material. Using values for the example of a lens made using ZnSe this becomes:

$$\Delta(nl)_{lens} = 6.1E-5 \times L \times \Delta t + 7.6E-5 \times 2.4 \times L \times \Delta t = 7.9E-5 \times L \times \Delta t$$

For the mirror the relationship is $$\Delta(nl)_{mirror} = -2 \times CTE \times L \times \Delta t$$

Using values for the example of a mirror made using ZnSe this becomes:

$$\Delta(nl)_{mirror} = -1.5E-5 \times L \times \Delta t$$

In order to achieve substantially complete compensation, the ratio of $\Delta(nl)_{lens}/\Delta(nl)_{mirror}$ determines, other conditions being equal, a relative ratio for the absorption of the lens 120 and the reflective coating of the thermal lens compensation plate 110. Thus, for the same material (ZnSe in the example) and the same absorption, the thermal lens of the thermal lens compensation plate 110 acting as a mirror is 7.9/1.5=5.3 times weaker than thermal lens of the lens 120. This means that for this example the absorption of the coating of the thermal lens compensation plate 110 should be 5.3 times the absorption of the lens 120 to achieve a compensating thermal lens effect, other conditions being the same. With the absorption thus determined, the thermal lens for the thermal lens compensation plate 110 should be the same in magnitude as but opposite in sign from the thermal lens for the lens 120, so that the former compensates for the later and reduces the temperature dependency of the overall focusing system.

In some circumstances it may also be desirable to compensate for the change in absorption of the lens 120 over its service lifetime. A lens 120 made of ZnSe has a typical initial absorption of about 0.15 percent. This absorption typically doubles over the lifetime of such a final focus lens to about 0.3 percent. It is preferable to choose the coating absorption on the thermal lens compensation plate 110 to match the absorption of the thermal lens 130 at the end of the lifetime of the thermal lens 130. This means that the coating on the thermal lens compensation plate 110 will have absorption of at least 0.3*5.3=1.6%. Molybdenum with an optical absorption of about 2 percent would provide an acceptably close match as a coating material.

If absorption of the coating on the thermal lens compensation plate 110 is based on absorption of the lens 120 at the end of its lifetime then it is preferable to adjust the thermal lens of the thermal lens compensation plate 110 at the beginning and over the course of the lifetime of the system. One technique for adjusting the thermal lens of the thermal lens compensation plate 110 involves the use of a cold plate 140 positioned behind the thermal lens compensation plate 110 as shown in FIG. 2. This cold plate 140 is adapted to provide substantially constant uniform cooling over the whole surface of the thermal lens compensation plate 110 with a controlled heat conductivity. The heat conductivity can be controlled by separating the cold plate 140 and the thermal lens compensation plate 110 by a gap 150 as shown and changing the temperature of the cold plate 140 with a cold plate temperature control 160. This will reduce the thermal lens of the thermal lens compensation plate 110 proportionally to the cooling flux. The temperature of the cold plate 140 is preferably set in the range of about −30° C. to about −10° C., and more preferably to about −10° C. when the lens 120 is first put into service and then gradually increased as the lens 120 ages. Alternatively, the gap 150 can also be changed to reduce cooling.

Figure 3:
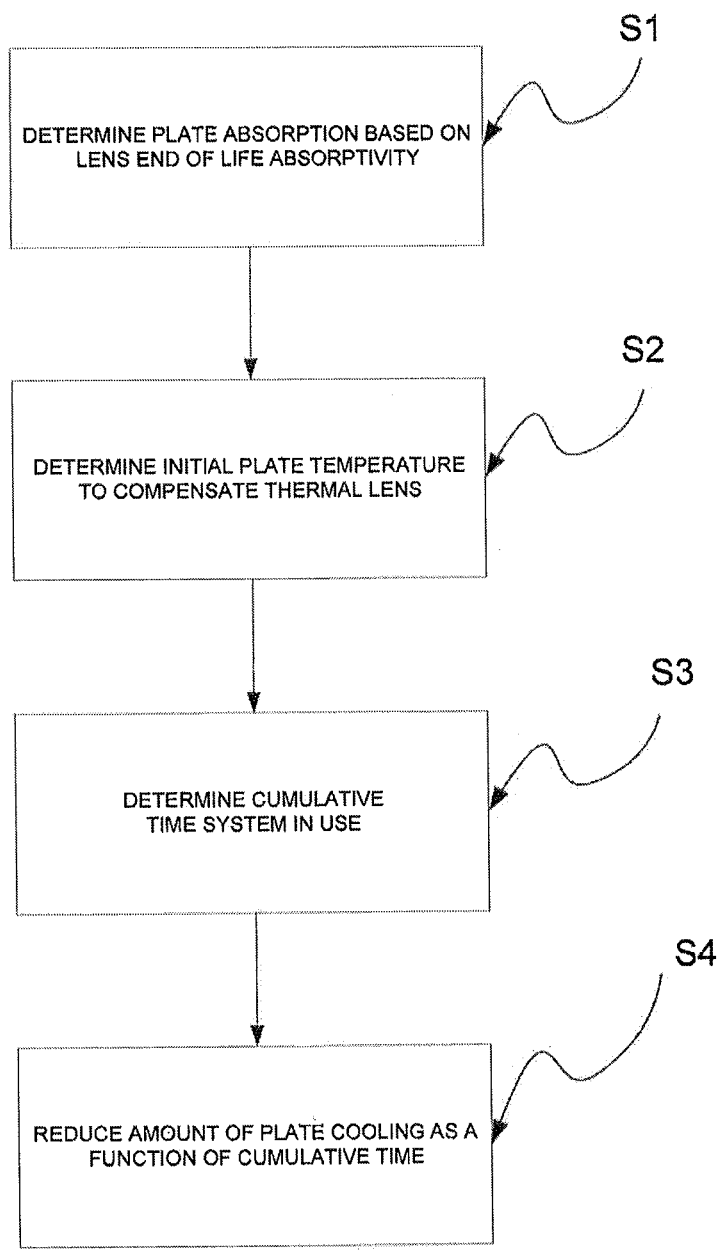
FIG. 3 is a flowchart showing steps of a method according to another aspect of the present invention.

FIG. 3 is a flowchart illustrating a method such as that just described for adjusting the amount of cooling applied to the thermal lens compensation plate 110 over the operational lifetime of the focusing system. In a first step S1 the absorption of the thermal lens compensation plate 110 is determined as set forth above using the expected end-of-lifetime value for absorption for the lens 120. In a step S2 an initial temperature of the thermal lens compensation plate 110 is determined which takes into account that the absorption of the thermal lens compensation plate 110 is high when compared to an initial value of the absorption of the lens 120 so that the thermal lens compensation plate 110 would overcompensate if not cooled. In a step S3 the cumulative time in use of the focusing system is determined. It will be understood that this could be determined continuously or periodically depending on system design requirements. In a step S4 the amount of cooling of the thermal lens compensation plate 110 is reduced as a function of cumulative time as determined in step S3. In other words, the thermal lens compensation plate 110 is cooled less, that is, allowed to operate at progressively higher temperatures, as the system ages so that its thermal lensing increases due to the rise in temperature as the thermal lensing of the lens 120 increases as its absorption increases.

The cold plate temperature control 160 may include a sensor for sensing the temperature of the cold plate 140. Alternatively, the sensor in the cold plate temperature control 160 could be adapted to measure a temperature related to the temperature of the cold plate 140 such as the temperature of the cooling water for the lens 120. Alternatively, the system can be calibrated from time to time and new temperature set point can be established through this calibration.

Figure 4:
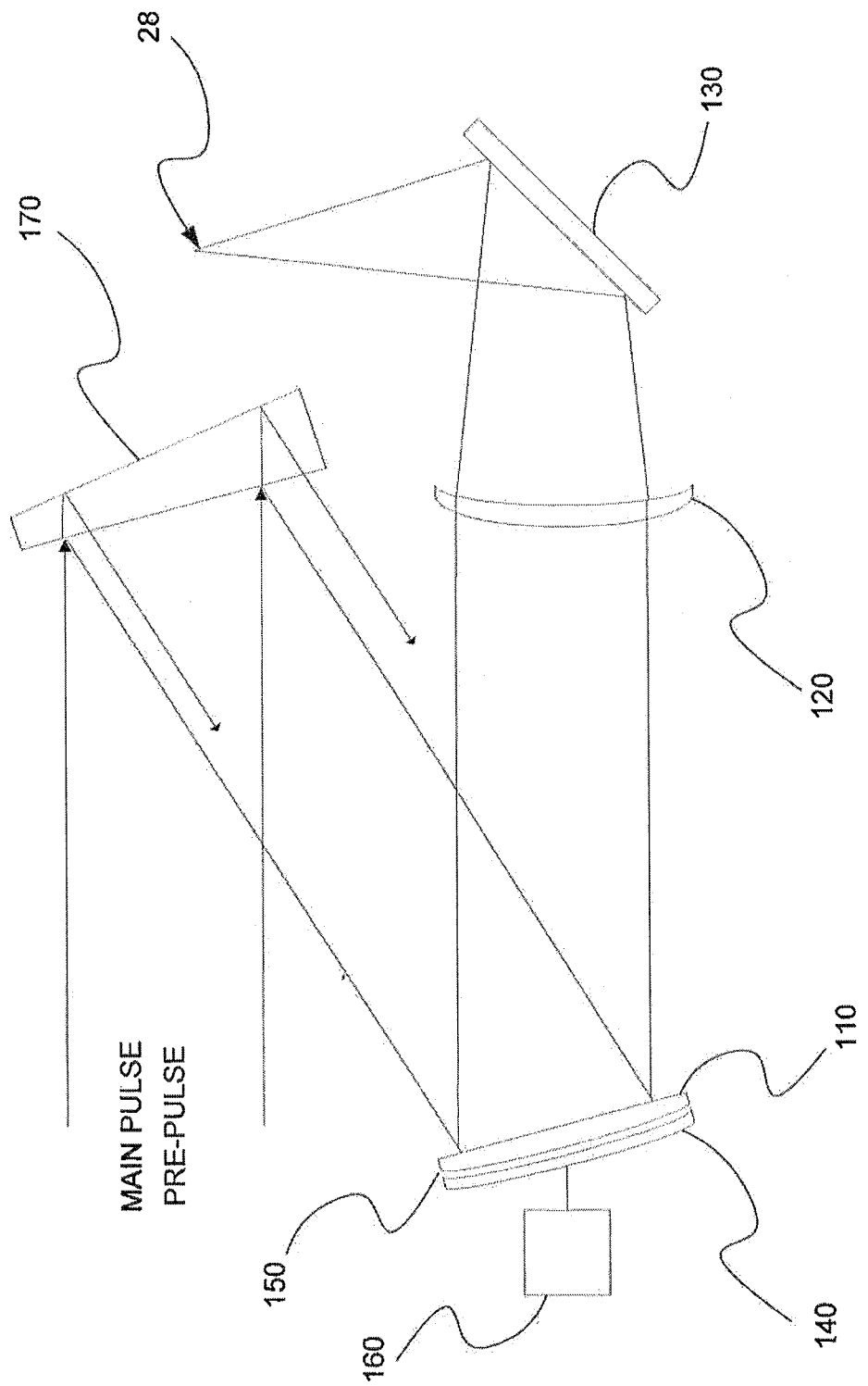
FIG. 4 is a diagrammatic not-to-scale view of a second embodiment of a laser source according to another aspect of the present invention.

FIG. 4 shows a second embodiment of a thermal lens compensation system according to the present invention. The embodiment of FIG. 4 can be used when the main pulse and the pre-pulse propagate through the same beam delivery system. Typically, the pre-pulse power is small compared to the main pulse power. Thus the thermal lens caused by the pre-pulse is typically small compared to the thermal lens caused by the main pulse. The thermal lens caused by the pre-pulse can, however, be compensated for as well if required by design considerations.

The embodiment of FIG. 4 is essentially the same as that of FIG. 2 except that the main pulse and the pre-pulse propagate along a common beam path. Instead of a pre-pulse combiner 100 the embodiment of FIG. 3 includes an optical wedge 170. If a pre-pulse from a $CO_2$ laser is used the optical wedge 170 is preferably made of ZnSe with a dichroic coating, with a front surface that is highly reflective for the main pulse and a back surface that is highly reflective to the pre-pulse. If a pre-pulse from a YAG laser is used, then the optical wedge 170 is preferably made of fused silica or ZnSe. Also, it may be preferable to curve the back surface of the optical wedge 170 to compensate for chromatic aberrations in the lens 120. Also, wedge 170 can have cooling on the back surface (not shown) to reduce its thermal lens.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A focusing system comprising:
   a transmissive optical element arranged to receive and focus a light beam, said transmissive optical element having a first thermal lens power having a first value and a first absorption; and
   a reflective thermal lens compensating plate arranged to receive said light beam at least indirectly from a light beam source and reflect said light beam before said light beam reaches said transmissive optical element, said reflective thermal lens compensating plate having a second thermal lens power having a second value and a second absorption;
   wherein the sign of said first value and said second value are opposite to one another and wherein a material for said reflective thermal lens compensating plate is chosen so that said second absorption relates to said first absorption and a relative absolute magnitude of said first value and said second value such that a thermal lens of said thermal lens compensating plate substantially completely compensates for a thermal lens of said transmissive optical element.

2. A focusing system as claimed in claim 1 wherein said transmissive optical element and said reflective thermal lens compensating plate both comprise the same material.

3. A focusing system as claimed in claim 2 wherein said transmissive optical element and said reflective thermal lens compensating plate both comprise potassium chloride.

4. A focusing system as claimed in claim 2 wherein said transmissive optical element and said reflective thermal lens compensating plate both comprise sodium chloride.

5. A focusing system as claimed in claim 2 wherein said transmissive optical element and said reflective thermal lens compensating plate both comprise potassium bromide.

6. A focusing system as claimed in claim 2 wherein said transmissive optical element and said reflective thermal lens compensating plate both comprise diamond.

7. A focusing system as claimed in claim 1 wherein said transmissive optical element and said reflective thermal lens compensating plate both comprise zinc selenide.

8. A focusing system as claimed in claim 1 wherein said reflective thermal lens compensating plate has a reflective coating, and wherein said second absorption is selected by selecting the absorption of the coating.

9. A focusing system as claimed in claim 8 wherein said reflective coating is on a front surface of said reflective thermal lens compensating plate.

10. A focusing system as claimed in claim 8 wherein said reflective coating is on a rear surface of said reflective thermal lens compensating plate.

11. A focusing system as claimed in claim 8 wherein said reflective coating comprises gold.

12. A focusing system as claimed in claim 8 wherein said reflective coating comprises copper.

13. A focusing system as claimed in claim 8 wherein said reflective coating comprises molybdenum.

14. A focusing system as claimed in claim 1 further comprising a pulse combiner.

15. A focusing system as claimed in claim 14 wherein a pre-pulse and a main pulse propagate along a common beam path before impinging on said pulse combiner and said pulse combiner comprises an optical wedge.

16. A focusing system as claimed in claim 15 wherein said pre-pulse is generated by a $CO_2$ laser and said optical wedge comprises ZnSe with a dichroic coating, with a front surface that is highly reflective to said main pulse and a back surface that is highly reflective to said pre-pulse.

17. A focusing system as claimed in claim 15 wherein said pre-pulse is generated by a YAG laser and said optical wedge comprises fused silica or ZnSe.

18. A focusing system as claimed in claim 15 wherein a back surface of said optical wedge is curved to compensate for chromatic aberrations in the final focus lens.

19. A focusing system as claimed in claim 14 wherein a pre-pulse and a main pulse propagate along separate beam paths before impinging on said pulse combiner.

20. A focusing system as claimed in claim 19 wherein said pre-pulse is generated by a $CO_2$ laser and said pulse combiner comprises ZnSe with a maximum metal reflector coating.

21. A focusing system as claimed in claim 19 wherein said pre-pulse is generated by a YAG laser and said pulse combiner comprises a material having a very low coefficient of thermal expansion.

22. A focusing system as claimed in claim 19 wherein said pre-pulse is generated by a YAG laser and said pulse combiner comprises a fused silica or a titania-silicate glass or a lithium aluminosilicate glass-ceramic.

23. A focusing system as claimed in claim 19 wherein said pre-pulse is generated by a YAG laser and said pulse combiner comprises a coating having high reflectivity at about 10.6 μm and high transmissivity at about 1.064 μm.

24. A focusing system comprising:
   a transmissive optical element arranged to receive and focus a light beam, said first transmissive optical element having a first thermal lens power having a first value and a first absorption, said first absorption increasing from a first absorption value to a second absorption value as a cumulative amount of time said first transmissive element is used to focus said light beam increases; and
   a reflective thermal lens compensating plate arranged to receive said light beam at least indirectly from a light beam source and reflect said light beam towards said transmissive optical element; said first transmissive element having a second thermal lens power having a second value and a second absorption;
   wherein the sign of said first value and said second value are opposite to one another and wherein said second absorption is selected based on said second absorption value and a relative absolute magnitude of said first value and said second value;
   and further comprising a cooling element in thermal communication with said thermal lens compensating plate, said cooling element controlling the temperature of said thermal lens compensating plate such that a thermal lens of said thermal lens compensating plate substantially completely compensates for a thermal lens of said transmissive optical element so that the optical characteristics of the focusing system are substantially independent of temperature.

25. A focusing system as claimed in claim 24 wherein said transmissive optical element and said reflective thermal lens compensating plate both comprise the same material.

26. A focusing system as claimed in claim 24 wherein said transmissive optical element and said reflective thermal lens compensating plate are both comprise zinc selenide.

27. A focusing system as claimed in claim 24 wherein said reflective thermal lens compensating plate has a reflective coating with an absorption substantially equal to said second absorption.

28. A focusing system as claimed in claim 27 wherein said reflective coating is on a front surface of said reflective thermal lens compensating plate.

29. A focusing system as claimed in claim 27 wherein said reflective coating is on a rear surface of said reflective thermal lens compensating plate.

30. A focusing system as claimed in claim 27 wherein said has a reflective coating comprises gold.

31. A focusing system as claimed in claim 27 wherein said has a reflective coating comprises copper.

32. A focusing system as claimed in claim 27 wherein said has a reflective coating comprises molybdenum.

33. A focusing system as claimed in claim 24 further comprising a pulse combiner.

34. A focusing system as claimed in claim 33 wherein a pre-pulse and a main pulse propagate along a common beam path before impinging on said pulse combiner and said pulse combiner comprises an optical wedge.

35. A focusing system as claimed in claim 34 wherein said pre-pulse is generated by a $CO_2$ laser and said optical wedge comprises ZnSe with a dichroic coating, with a front surface that is highly reflective for said main pulse and a back surface that is highly reflective to said pre-pulse.

36. A focusing system as claimed in claim 34 wherein said pre-pulse is generated by a YAG laser and said optical wedge comprises fused silica or ZnSe.

37. A focusing system as claimed in claim 34 wherein a back surface of said optical wedge is curved to compensate for chromatic aberrations in the final focus lens.

38. A focusing system as claimed in claim 24 wherein said focusing system is arranged such that a pre-pulse and a main pulse propagate along separate beam paths before impinging on said pulse combiner.

39. A focusing system as claimed in claim 38 wherein said pre-pulse is generated by a $CO_2$ laser and said pulse combiner comprises ZnSe with a maximum metal reflector coating.

40. A focusing system as claimed in claim 38 wherein said pre-pulse is generated by a YAG laser and said pulse combiner comprises a material having a very low coefficient of thermal expansion.

41. A focusing system as claimed in claim 38 wherein said pre-pulse is generated by a YAG laser and said pulse combiner comprises a fused silica or a titania-silicate glass or a lithium aluminosilicate glass-ceramic.

42. A focusing system as claimed in claim 38 wherein said pre-pulse is generated by a YAG laser and said pulse combiner comprises a coating having high reflectivity at about 10.6 μm and high transmissivity at about 1.064 μm.

43. A focusing system as claimed in claim 24 wherein said second absorption value is an expected end-of life value for said transmissive optical element.

44. A focusing system as claimed in claim 24 wherein said cooling element comprises a cooling plate in thermal communication with said thermal lens compensating plate.

45. A focusing system as claimed in claim 44 wherein said cooling element comprises a control system for controlling a temperature of said thermal lens compensating plate by controlling a temperature of said cooling plate.

46. A focusing system as claimed in claim 45 wherein said control system controls said temperature of said cooling plate based on an amount of time.

47. A focusing system as claimed in claim 44 wherein said cooling plate is separated from said thermal lens compensating plate by a gap.

48. A focusing system as claimed in claim 47 wherein said cooling element comprises a control system for controlling a temperature of said thermal lens compensating plate by controlling a thickness of said gap.

49. A focusing system as claimed in claim 45 wherein said control system controls said temperature of said cooling plate based on an amount of time.

* * * * *